United States Patent
Tsao et al.

(10) Patent No.: US 7,744,264 B2
(45) Date of Patent: Jun. 29, 2010

(54) SEMICONDUCTOR SOLID-STATE LIGHT-SOURCE MODULE AND ASSEMBLY HAVING THE SAME

(75) Inventors: Chih-Chung Tsao, Miao-Li Hsien (TW); Chih-Peng Hsu, Miao-Li Hsien (TW); Wen-Jang Jiang, Miao-Li Hsien (TW); Chun-Wei Wang, Miao-Li Hsien (TW); Chih-Ming Lai, Miao-Li Hsien (TW); Hung-Kuang Hsu, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 0 days.

(21) Appl. No.: 12/202,557

(22) Filed: Sep. 2, 2008

(65) Prior Publication Data

US 2009/0116235 A1  May 7, 2009

(30) Foreign Application Priority Data

Nov. 6, 2007  (CN)  .................... 2007 1 0202396

(51) Int. Cl.
*F21V 7/04* (2006.01)
(52) U.S. Cl. .................. 362/631; 362/97.3; 362/368
(58) Field of Classification Search .......... 362/33, 362/97.1, 97.3, 97.04, 235–238, 240, 244, 362/246, 249.02, 249.04, 368, 559, 631, 362/646, 800, 812; 361/728–733, 736, 741; 345/1.3; 40/541, 542, 546, 552, 563, 564, 40/573, 605, 624
See application file for complete search history.

(56) References Cited

U.S. PATENT DOCUMENTS

| | | | | |
|---|---|---|---|---|
| 5,572,812 A | * | 11/1996 | Mastuoka | 40/204 |
| 5,771,617 A | * | 6/1998 | Baker | 40/544 |
| 5,995,179 A | * | 11/1999 | Tamura et al. | 349/58 |
| 6,422,716 B2 | * | 7/2002 | Henrici et al. | 362/235 |
| 6,557,282 B1 | * | 5/2003 | Cleaver | 40/541 |
| 6,558,021 B2 | * | 5/2003 | Wu et al. | 362/235 |
| 6,745,507 B2 | * | 6/2004 | Golding | 40/564 |
| 6,799,865 B2 | * | 10/2004 | Ellens et al. | 362/240 |
| 6,881,946 B2 | * | 4/2005 | Cok et al. | 250/208.6 |
| 7,080,927 B2 | * | 7/2006 | Feuerborn et al. | 362/368 |
| 7,355,562 B2 | * | 4/2008 | Schubert et al. | 345/1.3 |
| 7,442,950 B2 | * | 10/2008 | Osame et al. | 250/552 |
| 2006/0289201 A1 | * | 12/2006 | Kim et al. | 174/261 |

FOREIGN PATENT DOCUMENTS

| | | | |
|---|---|---|---|
| CN | 1790467 A | | 6/2006 |
| CN | 1885125 A | | 12/2006 |
| GB | 2164189 A | * | 3/1986 |
| JP | 2002-50843 A | | 2/2002 |
| JP | 2002050843 A | * | 2/2002 |

* cited by examiner

*Primary Examiner*—Hargobind S Sawhney
(74) *Attorney, Agent, or Firm*—Andrew C. Cheng (57) ABSTRACT

An exemplary semiconductor solid-state light-source module includes a printed circuit board, at least one semiconductor solid state light source mounted on the printed circuit board and a light guide plate optically coupled to the semiconductor solid state light source. The printed circuit board includes a protrusion and a recess. The protrusion is configured for engaging with a recess of the printed circuit board of another similar semiconductor solid-state light-source module.

1 Claim, 9 Drawing Sheets

SEMICONDUCTOR SOLID-STATE LIGHT-SOURCE MODULE AND ASSEMBLY HAVING THE SAME

CROSS-REFERENCE TO RELATED APPLICATIONS

This application is related to the following commonly-assigned copending application: Ser. No. 12/100,294, entitled "LIGHT EMITTING DIODE BASED ILLUMINATION DEVICE". Disclosures of the above-identified application are incorporated herein by reference.

BACKGROUND

1. Technical Field

The present invention generally relates to semiconductor solid-state light-source modules and semiconductor solid state light source assemblies having the same.

2. Discussion of Related Art

Nowadays, conventional display modules generally employ cold cathode fluorescent lamp (CCFL) as light source. A display module generally includes a lamp case, and at least one CCFL arranged therein. However, the CCFL is bulky and not environmental friendly.

Light emitting diode (LED) has been used extensively as light source for display modules due to its pollution free, high luminous efficiency and small size. A conventional display module usually includes a plurality of LEDs arranged on a printed circuit board with high density to form an LED array. According to different requirements, the LED array may have different sizes. If a portion of the LED array malfunctions, then the whole LED arrays must be replaced, this is expensive.

Therefore, what is needed is a semiconductor solid-state light-source module that overcomes the above described shortcomings.

SUMMARY

A semiconductor solid-state light-source module, in accordance with a present embodiment, is provided. The semiconductor solid-state light-source module includes a printed circuit board, at least one semiconductor solid state light source mounted on the printed circuit board and a light guide plate optically coupled to the semiconductor solid state light source. The printed circuit board includes a protrusion and a recess. The protrusion is configured for engaging with a recess of the printed circuit board of another similar semiconductor solid-state light-source module.

Detailed features of the present semiconductor solid-state light-source module will become more apparent from the following detailed description and claims, and the accompanying drawings.

BRIEF DESCRIPTION OF THE DRAWINGS

Many aspects of the present semiconductor solid-state light-source module can be better understood with reference to the following drawings. The components in the drawings are not necessarily drawn to scale, the emphasis instead being placed upon clearly illustrating the principles of the present semiconductor solid-state light-source module. Moreover, in the drawings, like reference numerals designate corresponding parts throughout the several views, wherein.

DETAILED DESCRIPTION OF THE PREFERRED EMBODIMENTS

Reference will now be made to the drawings to describe the embodiments of the present semiconductor solid-state light-source module, in detail.

Figure 1:
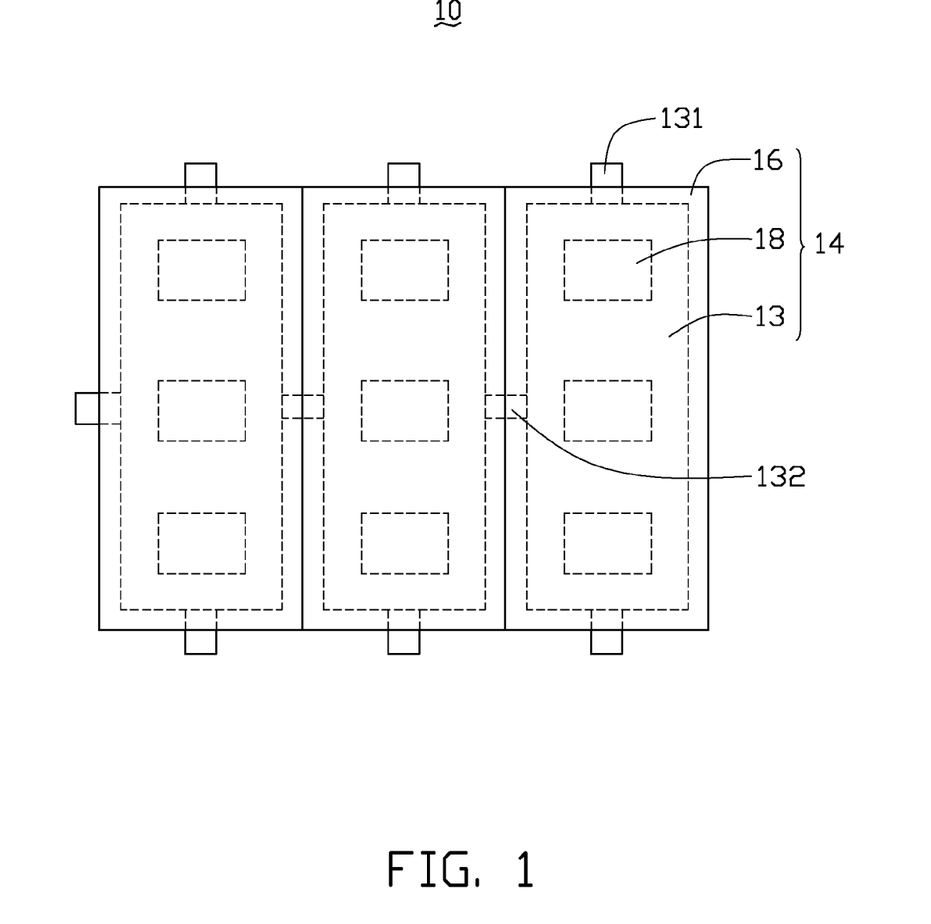
FIG. 1 is a schematic isometric view of a semiconductor solid-state light-source module, according to a first exemplary embodiment.
Figure 2:
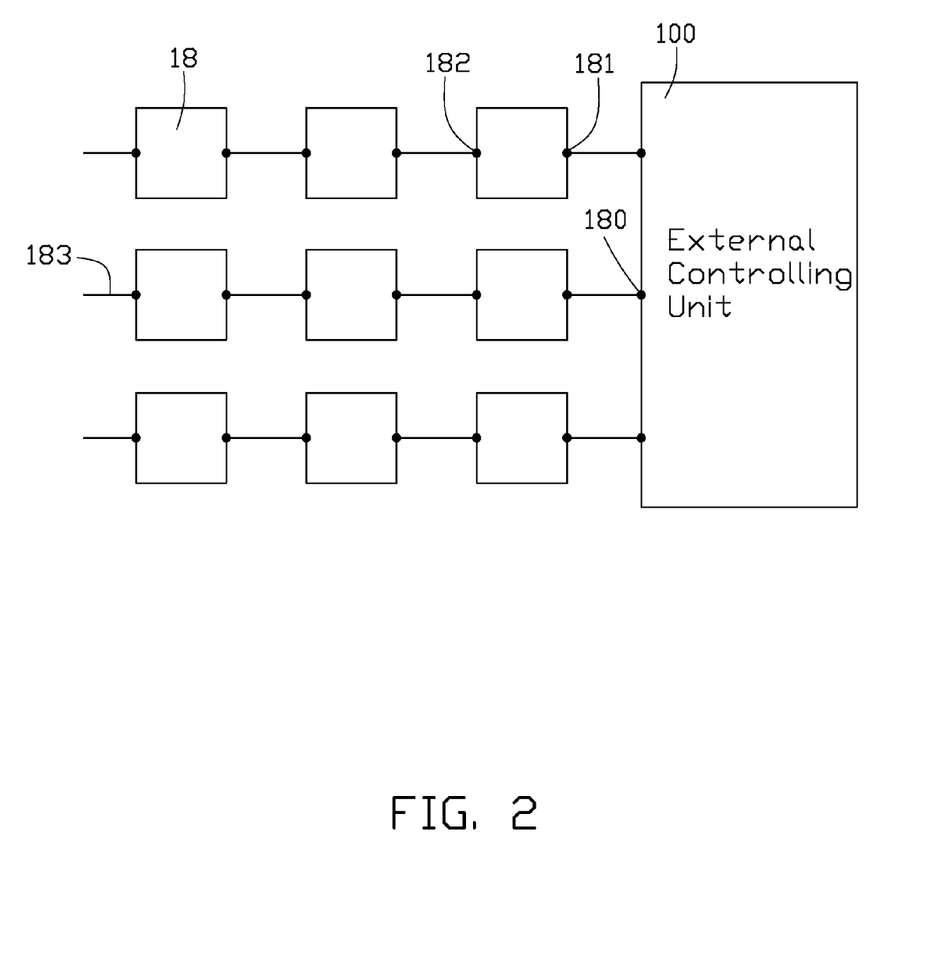
FIG. 2 is a schematic view showing a circuit of the semiconductor solid state light sources as illustrated in FIG. 1.

Referring to FIG. 1 and FIG. 2, a semiconductor solid-state light-source module 10 according to a first exemplary embodiment is provided. The semiconductor solid-state light-source module 10 includes three semiconductor solid state light source cells 14 with the same configuration.

Each semiconductor solid state light source cell 14 includes a printed circuit board 13, three semiconductor solid state light sources 18 and a light guide plate 16. Each semiconductor solid state light sources 18 has a light emitting surface. The light emitting surface of each of the semiconductor solid state light sources 18 faces toward the light guide plate 16.

Figure 3:
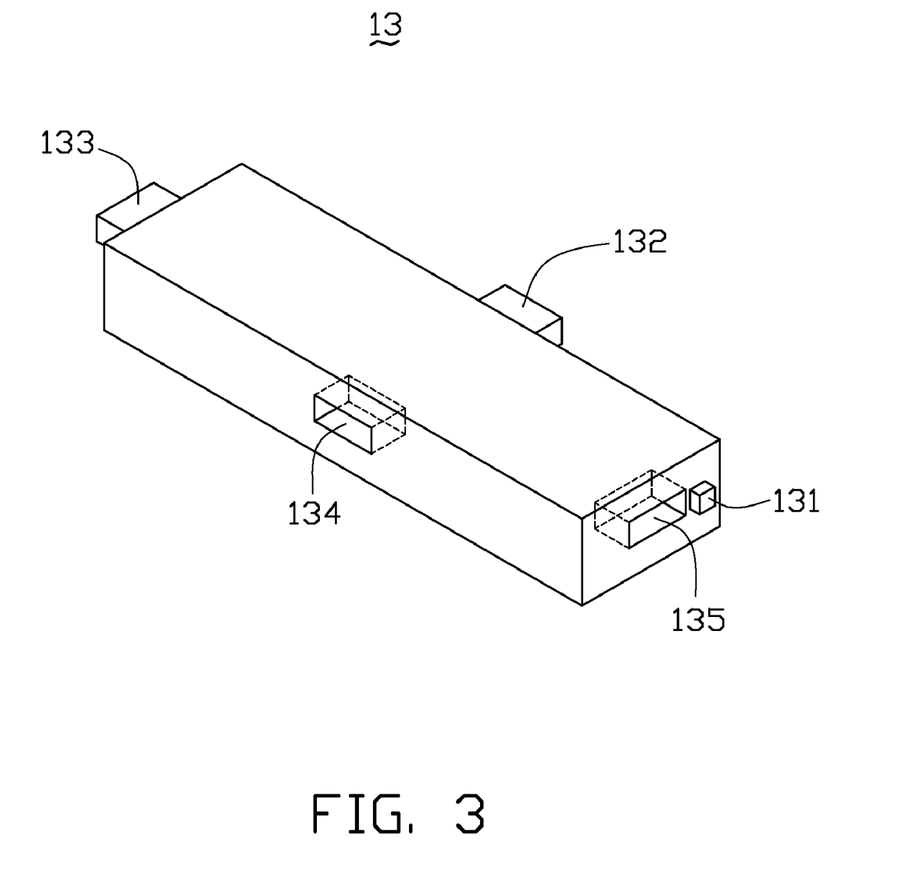
FIG. 3 is a schematic view of a printed circuit board of the semiconductor solid-state light-source module as illustrated in FIG. 1.

Particularly referring to FIG. 3, the printed circuit board 13 includes a power interface 131, a first protrusion 132, a second protrusion 133, a first receptacle 134 opposite to the first protrusion 132, and a second receptacle 135 opposite to the second protrusion 133. The power interface 131 is electrically connected to an external power supply (not illustrated).

Each semiconductor solid state light source 18 includes a positive electrode 181 and a negative electrode 182 (see FIG. 2). The three semiconductor solid state light sources 18 are electrically connected in series and cooperatively form a light source module. The light source module is electrically connected between an external controlling unit 100 and the power interface 131.

The semiconductor solid state light source cells 14 connect to each other by the engagement of protrusions and receptacles. The semiconductor solid state light source cells 14 can be powered on or powered off by triggers signals sent from the external controlling unit 100 so that the semiconductor solid state light source cell 14 is capable of representing different states according to the trigger signals.

Due to engagement of the protrusions 132, 133 and the receptacles 134, 135, a plurality of semiconductor solid state light source cells 14 can be detachably connected together and thereby facilitate display function. When an individual semiconductor solid state light source cell 14 fails to work, it can be disassembled and replaced individually.

It is to be said that, the number of the semiconductor solid state light source cells 14 of the semiconductor solid-state light-source module 10 can also be one, two, four, five or more, and each of the semiconductor solid state light source cell 14 can also includes two, four, five, or more semiconductor solid state light sources 18 electrically connected in series.

Figure 4:
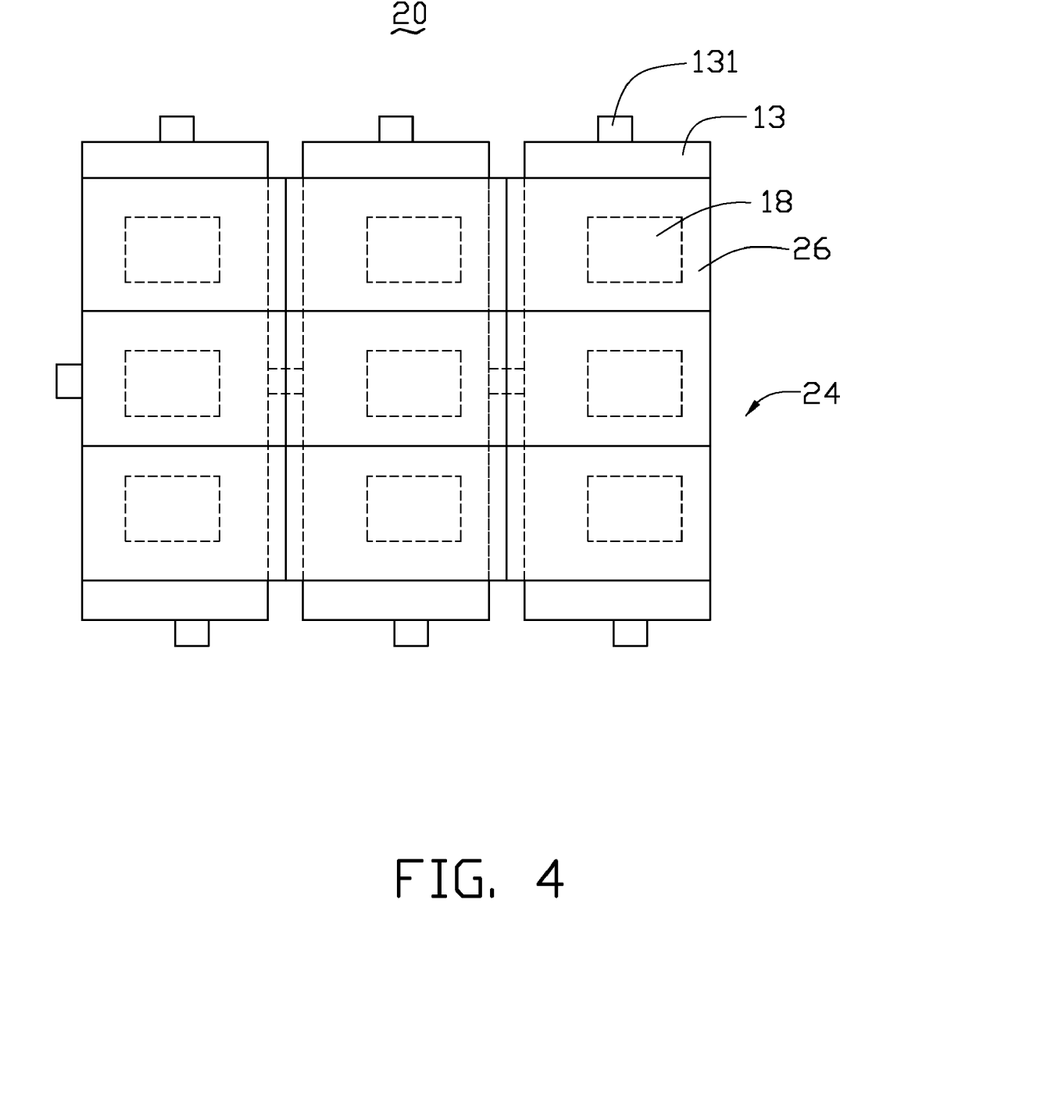
FIG. 4 is a schematic isometric view of a semiconductor solid-state light-source module, according to a second exemplary embodiment.
Figure 5:
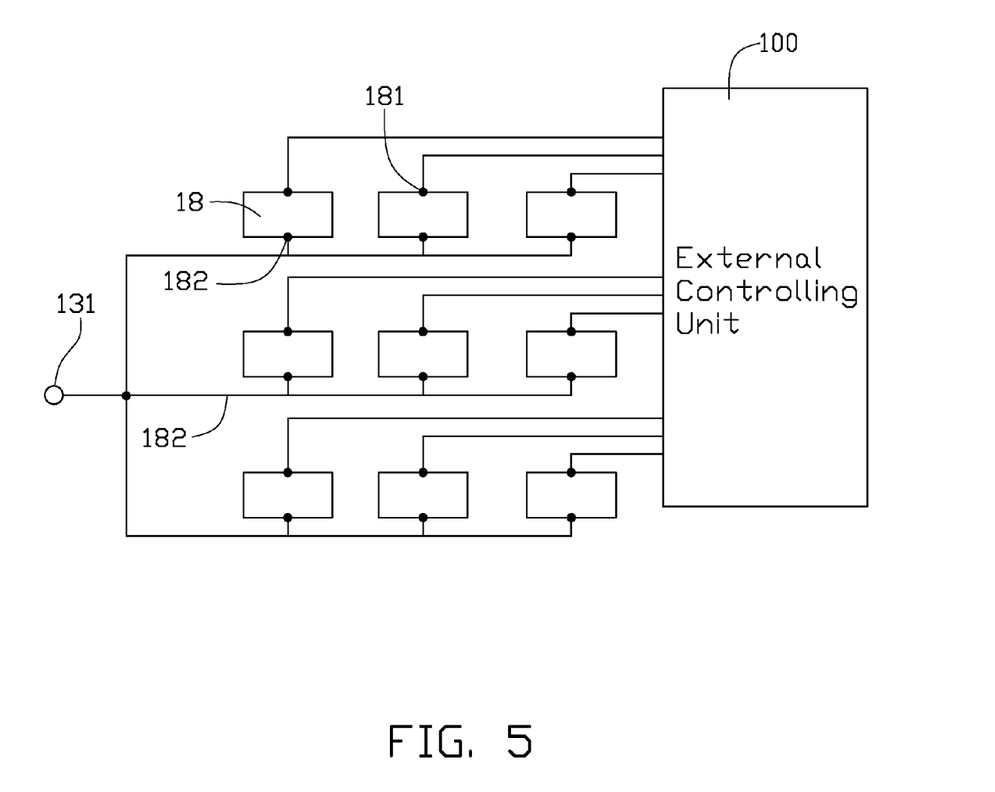
FIG. 5 is a schematic view showing a circuit of the semiconductor solid state light sources as illustrated in FIG. 4.

Referring to FIG. 4 or FIG. 5, a semiconductor solid-state light-source module 20 according to a second exemplary embodiment is provided. The semiconductor solid-state light-source module 20 has a configuration similar to the semiconductor solid-state light-source module 10. The semiconductor solid-state light-source module 20 includes three semiconductor solid state light source cells 24 with the same configuration. Each semiconductor solid state light source cell 24 includes a printed circuit board 13 and three semiconductor solid state light sources 18.

The difference is that, each semiconductor solid state light source cell 24 further includes three light guide plates 26, each of which arranged on a respective light emitting surface of the three semiconductor solid state light sources 18. The three semiconductor solid state light sources 18 are electrically connected in parallel. Each positive electrode 181 of the semiconductor solid state light sources 18 is connected to the external controlling unit 100 and each negative electrode 182 of the semiconductor solid state light sources 18 is connected to the power interface 131.

Figure 6:
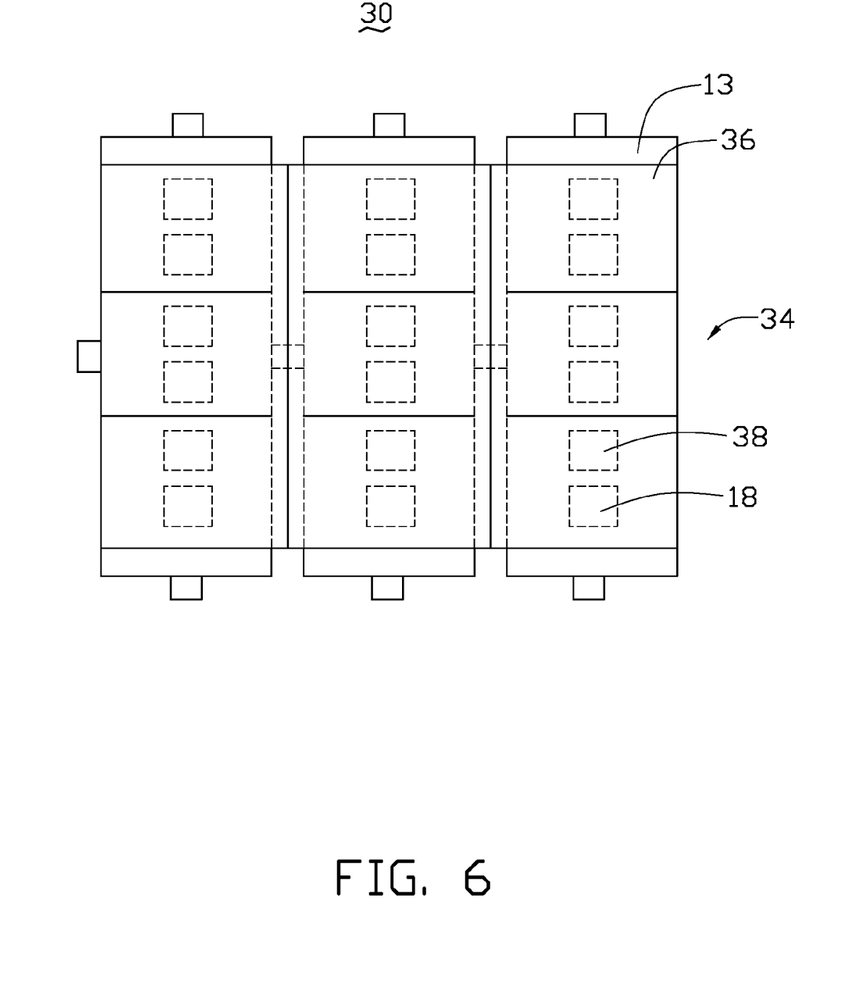
FIG. 6 is a schematic isometric view of a semiconductor solid-state light-source module, according to a third exemplary embodiment.
Figure 7:
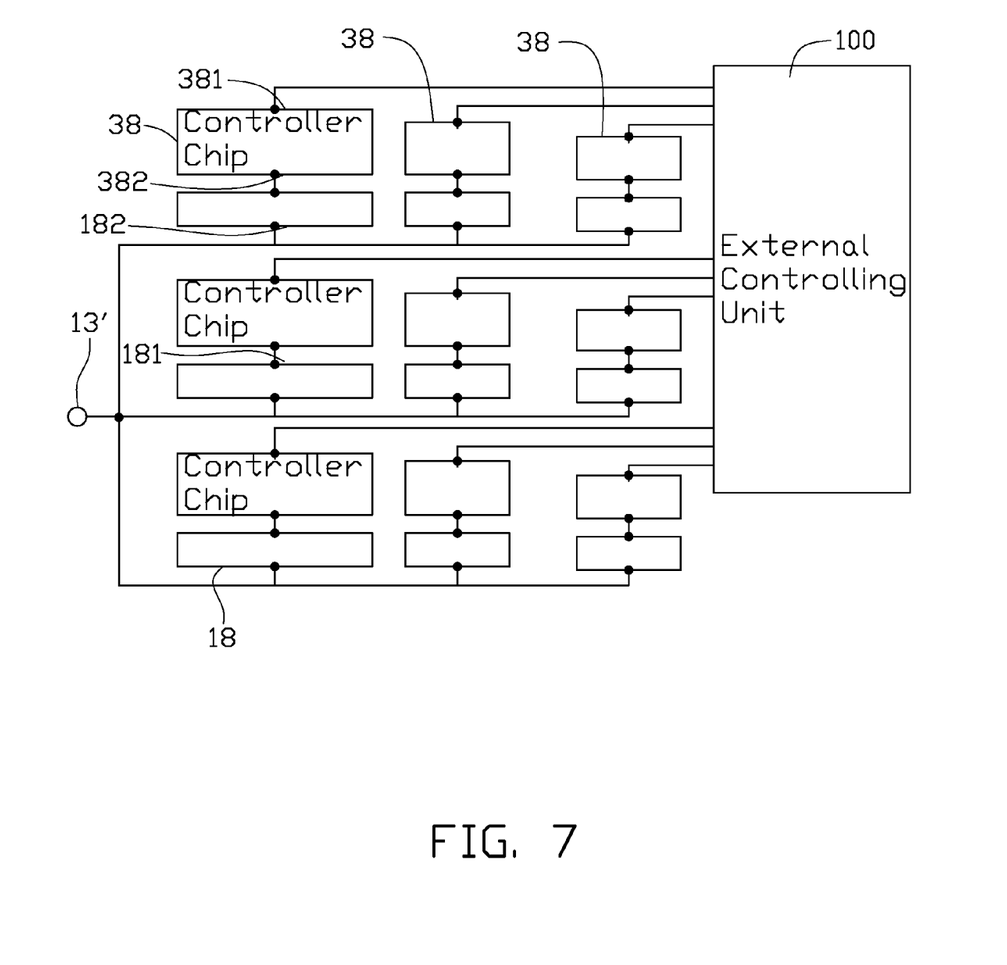
FIG. 7 is a schematic view showing a circuit of the semiconductor solid state light sources as illustrated in FIG. 6.

Referring to FIG. 6 and FIG. 7, a semiconductor solid-state light-source module 30 according to a third exemplary embodiment is provided. The semiconductor solid-state light-source module 30 has a configuration similar to the semiconductor solid-state light-source module 20. The semiconductor solid-state light-source module 30 includes three semiconductor solid state light source cells 34 with the same configuration. Each semiconductor solid state light source cell 34 includes a printed circuit board 13, three semiconductor solid state light sources 18 and three light guide plates 36. Each of the three light guide plates 36 is arranged on a respective light emitting surface of the semiconductor solid state light sources 18.

The difference is that each of the semiconductor solid state light source cells 34 further includes three controller chips 38. Each controller chip 38 includes a signal input port 381 and a signal output port 382. Each of the signal input port 381 is connected to a respective positive electrode 181 of the semiconductor solid state light sources 18. Each of the signal output port 382 is connected to a respective negative electrode 182 of the semiconductor solid state light sources 18. The negative electrodes 182 of the semiconductor solid state light sources 18 are connected to the power interface 131.

When the signal input ports 381 receive trigger signals sent by the external controlling unit 100, the signal output ports 382 each outputs a controlling signal to the corresponding semiconductor solid state light source 18 according to the trigger signals, thereby the semiconductor solid state light sources 18 represents different states.

Figure 8:
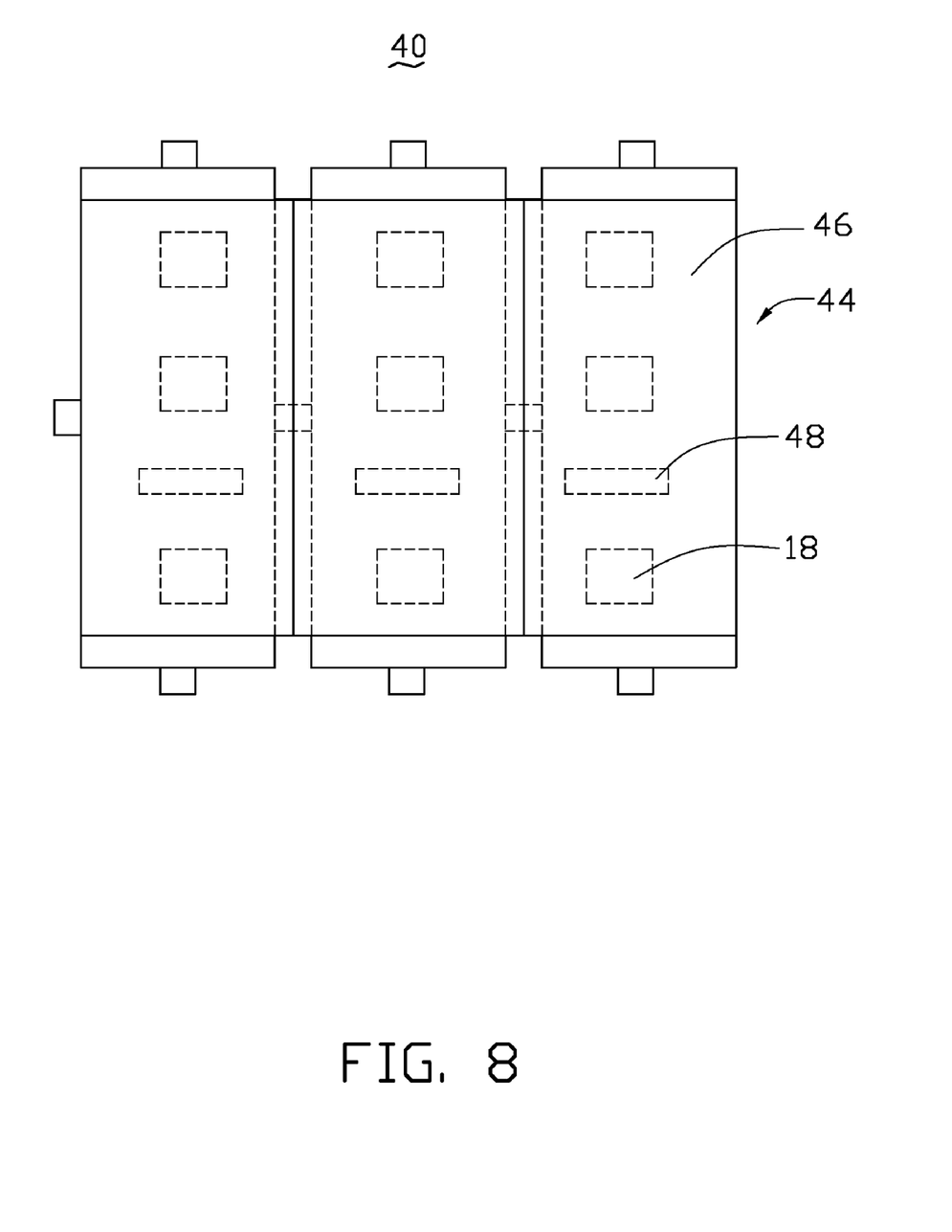
FIG. 8 is a schematic isometric view of a semiconductor solid-state light-source module, according to a fourth exemplary embodiment.
Figure 9:
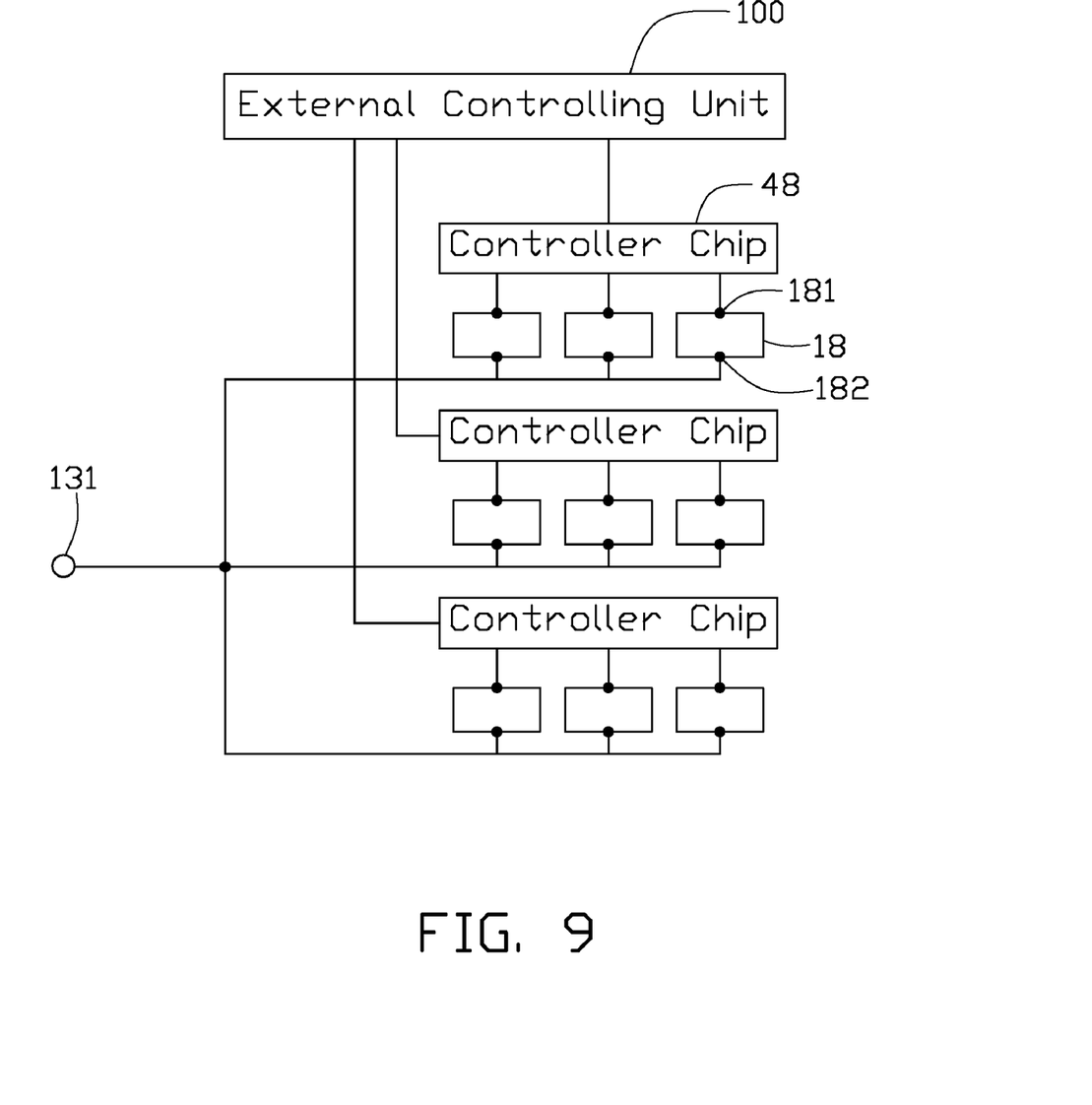
FIG. 9 is a schematic view showing a circuit of the semiconductor solid state light sources as illustrated in FIG. 8.

Referring to FIG. 8 and FIG. 9, a semiconductor solid-state light-source module 40 according to a fourth exemplary embodiment is provided. The semiconductor solid-state light-source module 40 has a configuration similar to the semiconductor solid-state light-source module 30. The semiconductor solid-state light-source module 40 includes three semiconductor solid state light source cells 44 with the similar configuration.

The difference is that the three semiconductor solid state light source cells 44 include a community controller chip 48 and a community light guide plate 46. The controller chip 48 is respectively connected to the positive electrodes 181 of the semiconductor solid state light sources 18. The negative electrodes 182 of the semiconductor solid state light sources 18 are connected to the power interface 131. The light emitting surface of each of the semiconductor solid state light sources 18 faces towards the light guide plate 46.

Finally, it is to be understood that the above-described embodiments are intended to illustrate rather than limit the invention. Variations may be made to the embodiments without departing from the spirit of the invention as claimed. The above-described embodiment illustrates the scope of the invention but do not restrict the scope of the invention.

What is claimed is:

1. A semiconductor solid-state light-source module, comprising:

a printed circuit board, at least one semiconductor solid state light source mounted on the printed circuit board; and a light guide plate optically coupled to the at least one semiconductor solid state light source, wherein the printed circuit board comprises a first protrusion, a second protrusion, a first recess opposite to the first protrusion, and a second recess opposite to the second protrusion, the first protrusion thereof configured for engaging in the first recess of the printed circuit board of another same semiconductor solid-state light-source module along a first direction, the second protrusion thereof configured for engaging in the second recess of the printed circuit board of another same semiconductor solid-state light-source module along a second direction approximately perpendicular to the first direction;

wherein the printed circuit board further comprises a power interface configured for electrical connection to an external power supply, the power interface being electrically connected to the at least one semiconductor solid state light source;

wherein the semiconductor solid-state light-source module further comprises an external controlling unit, wherein the at least one semiconductor solid state light source comprises a plurality of semiconductor solid state light sources electrically connected in parallel, each of the semiconductor solid state light sources includes a first electrode connected to the external controlling unit, and a second electrode connected to the power interface, and the external controlling unit is configured for controlling on-off states of the semiconductor solid state light sources;

wherein the semiconductor solid-state light-source module further comprises a plurality of controller chips, wherein the first electrode of each semiconductor solid state light source is connected to the external controlling unit by the respective controller chip, and the external controlling unit is configured for controlling the controller chips to control on-off states of the corresponding semiconductor solid state light sources.

* * * * *